United States Patent [19]

Hara et al.

[11] Patent Number: 4,876,441

[45] Date of Patent: Oct. 24, 1989

[54] CARD-LIKE ELECTRONIC APPARATUS

[75] Inventors: Kazuya Hara; Takanori Inoue, both of Tokyo; Hiroyasu Bito, Oome, all of Japan

[73] Assignee: Casio Computer Co., Ltd., Tokyo, Japan

[21] Appl. No.: 102,575

[22] Filed: Sep. 29, 1987

Related U.S. Application Data

[63] Continuation-in-part of Ser. No. 711,422, Mar. 13, 1985.

[30] Foreign Application Priority Data

| Mar. 27, 1984 | [JP] | Japan | 59-43975 |
| Aug. 15, 1984 | [JP] | Japan | 59-124608 |
| Oct. 3, 1986 | [JP] | Japan | 61-235745 |
| Nov. 19, 1986 | [JP] | Japan | 61-176633[U] |
| Nov. 27, 1986 | [JP] | Japan | 61-181089[U] |
| Nov. 29, 1986 | [JP] | Japan | 61-182800[U] |
| Dec. 4, 1986 | [JP] | Japan | 61-186130[U] |

[51] Int. Cl.⁴ .......................................... G06K 19/02
[52] U.S. Cl. ................................ 235/488; 235/490; 235/492; 364/708; 364/705.01
[58] Field of Search .................... 235/490, 492, 488; 364/705.1, 705.6, 708

[56] References Cited

U.S. PATENT DOCUMENTS

| 3,651,312 | 3/1972 | Barney . |
| 4,013,894 | 3/1977 | Foote et al. . |
| 4,092,526 | 5/1978 | Beck . |
| 4,096,577 | 6/1978 | Ferber et al. . |
| 4,152,476 | 5/1979 | Stillman . |
| 4,158,230 | 6/1979 | Washiznka et al. . |
| 4,222,516 | 9/1980 | Badet et al. . |
| 4,261,042 | 4/1981 | Ishiwatari et al. . |
| 4,263,659 | 4/1981 | Hirata et al. . |
| 4,356,391 | 10/1982 | Takeda . |
| 4,529,870 | 7/1985 | Chaum . |
| 4,558,427 | 12/1985 | Takeuchi et al. . |
| 4,563,575 | 1/1986 | Hoppe et al. . |
| 4,614,861 | 9/1986 | Paulov et al. . |
| 4,620,727 | 11/1986 | Stockburger et al. . |
| 4,627,736 | 12/1986 | Komaki . |
| 4,707,594 | 11/1987 | Roth ........................... 235/492 X |
| 4,754,418 | 6/1988 | Hara ............................... 364/708 |

FOREIGN PATENT DOCUMENTS

| 0068539 | 5/1983 | European Pat. Off. . |
| 1491822 | 11/1977 | United Kingdom . |
| 2112324 | 7/1983 | United Kingdom . |
| 2116777 | 9/1983 | United Kingdom . |

OTHER PUBLICATIONS

IEEE spectrum vol. 11, No. 12, Dec. '74 pp. 56–62, Svigals and Ziegler, Magnetic-Stripe Credit Cards: Big Business In The Offing.

*Primary Examiner*—David L. Trafton
*Attorney, Agent, or Firm*—Frishauf, Holtz, Goodman & Woodward

[57] ABSTRACT

A card-like electronic apparatus comprises a core member an electronic assembly, an upper cover, and a lower cover. The core member includes a frame having an accommodation section for accommodating the electronic assembly, and a thick portion protruding from the frame. The electronic assembly is arranged in the accommodation section and includes a printed circuit board having a plurality of stational key contacts, an IC chip, an electronically-driven display unit, and a thin flat battery. The upper cover is arranged on one surface of said electronic assembly and includes a pressure-deformable sheet having movable key contacts aligned with said stational key contacts, key indicia aligned with the movable key contacts, and a display window aligned with the display unit. The lower cover includes a supporting plate, arranged over another surface of said electronic assembly, having a cutaway portion in which said thick portion is fitted, and which has high rigidity. An embossment is formed in such a way that each of the upper cover, the thick portion of the core member, and the lower cover has one surface recessed and other surface protruding. A magnetic stripe portion is provided on the lower cover.

22 Claims, 12 Drawing Sheets

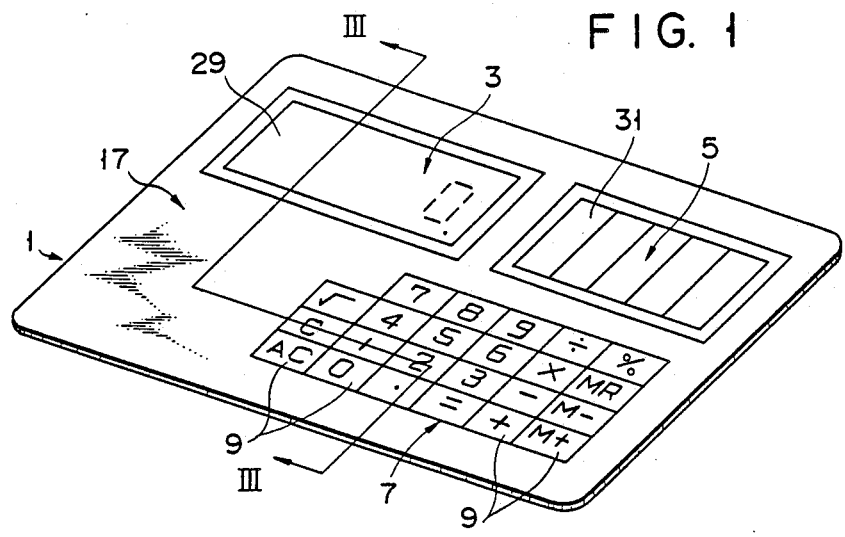
FIG. 1
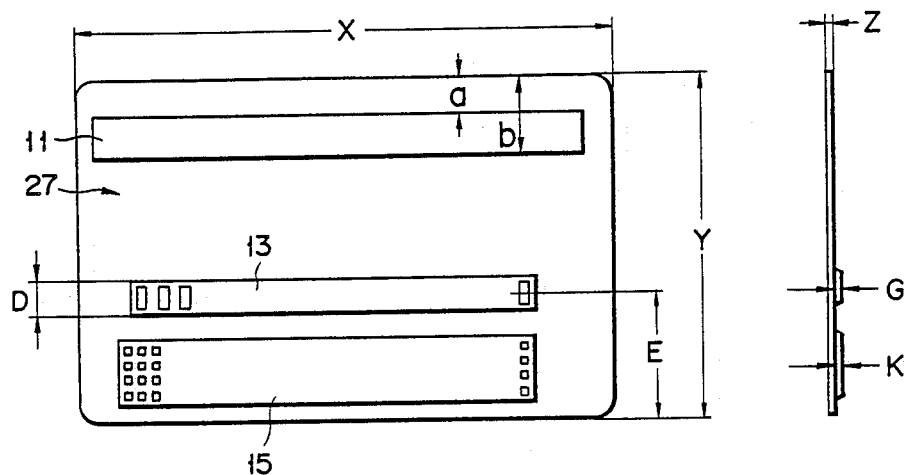
FIG. 2
FIG. 5
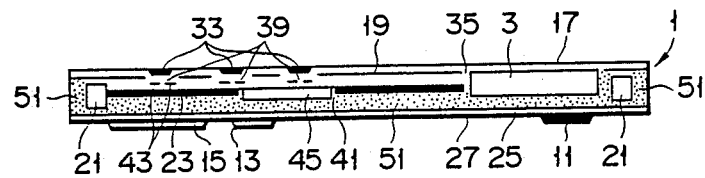
FIG. 3

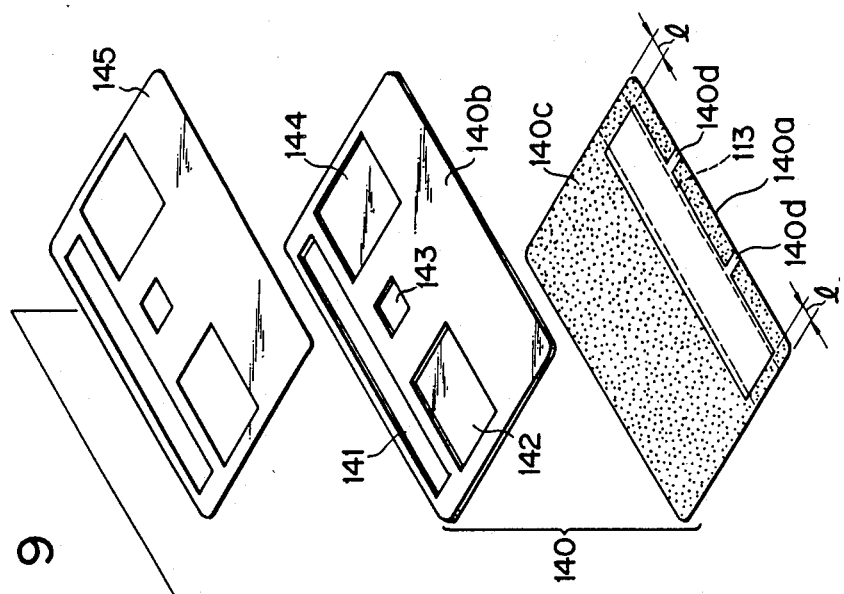
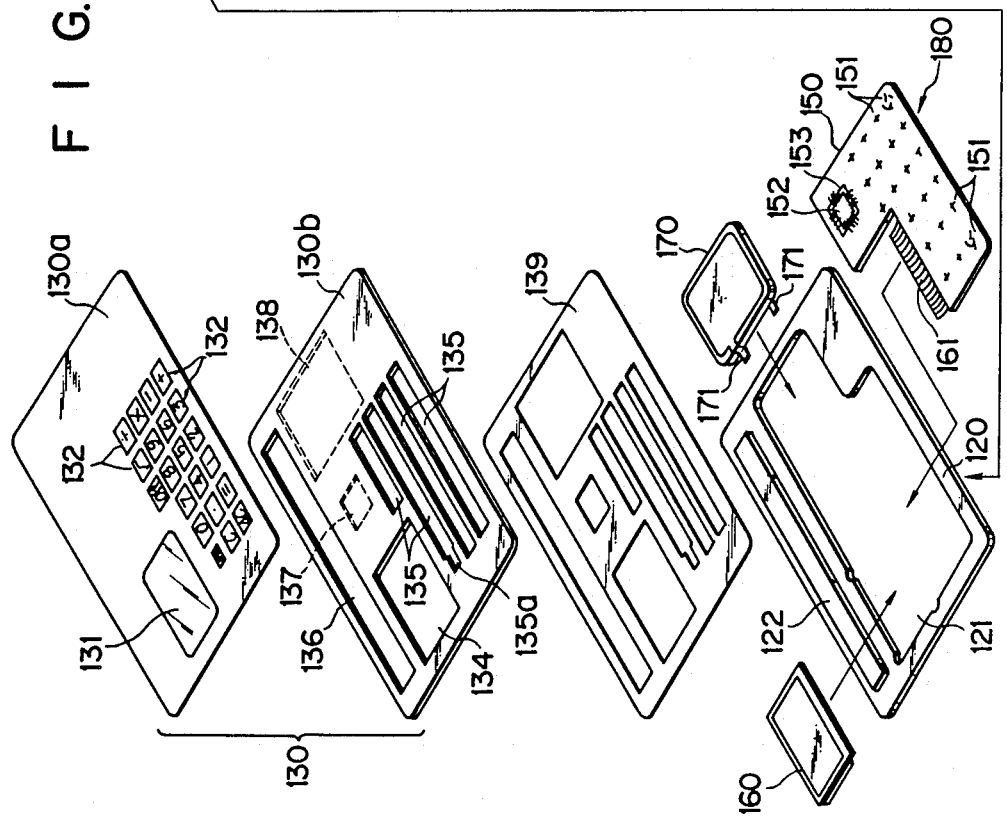
FIG. 9

CARD-LIKE ELECTRONIC APPARATUS

This is a continuation-in-part of prior co-pending application Ser. No. 711,422 filed Mar. 13, 1985.

BACKGROUND OF THE INVENTION

The present invention relates to a card-like electronic apparatus with a credit card function.

Recently, compact electronic calculators have become very thin—for example, an electronic calculator described in Japanese Patent Disclosure No. 58-207163 (U.S. application No. 468,401 filed 02/22/83) has a thickness of only 0.8 mm. Meanwhile, the credit card system has expanded greatly, with a large number of banking, financial, and service institutions, and the like now issuing such cards. In Japan, for example, the total number of these credit cards already exceeds one hundred million, with a large number of people having more than one credit card. However, at present, cardholders must separate electronic calculators and credit cards, separately, which results in a degree of inconvenience.

SUMMARY OF THE INVENTION

It is an object of the present invention to provide a card-like electronic apparatus which also functions as a credit card.

The card-like electronic apparatus according to the present invention comprises:

electronic assembly means including a printed circuit board having a plurality of key contacts, an IC chip, an electronically-driven thin display unit, and a thin flat battery;

an upper cover located on the top surface of the electronic assembly means and including a pressuredeformable sheet member having key indicia aligned with the key contacts and a display window aligned with the display unit;

a lower cover including frame means having an accommodation section formed therein, to accommodate the electronic assembly means, and a supporting member situated over one surface of the electronic assembly means and having higher rigidity than the sheet member; and a plastic sheet adhered to the supporting member and having a magnetic stripe portion on which identification data is recorded.

With this arrangement, the above-described electronic apparatus can also serve as a credit card.

BRIEF DESCRIPTION OF THE DRAWINGS

FIG. 1 is a perspective view of an electronic calculator according to the first embodiment of the present invention;

FIG. 2 is a front view of the lowermost sheet of the electronic calculator shown in FIG. 1;

FIG. 3 is a sectional view taken along line III—III of the electronic calculator shown in FIG. 1;

FIG. 5 is a side view of the electronic calculator shown in FIG. 1;

FIGS. 7 to 16 illustrate the second embodiment of this invention, in which:

FIG. 7 is an overall perspective view of the card feeding rollers of a dispensing machine, such as a cash dispenser, and a card, for explaining the positional relationship therebetween;

FIG. 8 is a perspective view of the back of the card shown in FIG. 7;

FIG. 9 is an exploded perspective view of the card shown in FIG. 7;

FIG. 10 is an enlarged cross-sectional view of the card of FIG. 7, taken along line IV—IV;

FIG. 11 is a plan view of a support plate for an upper panel;

FIGS. 13 to 15 are respective plan views of modifications of the support plate of the upper panel shown in FIG. 11;

FIG. 16 is a diagram for explaining the positional relationships between an embossed portion, a roller guide region, a bar code region, and a magnetic stripe portion of the card; and FIGS. 17 to 19 are diagrams illustrating the third embodiment of this invention, in which:

FIG. 17 is a perspective view of the back of an overall card;

FIG. 18 is an exploded perspective view of the card shown in FIG. 17; and

FIG. 19 is an enlarged cross-sectional view of the card shown in FIG. 17.

DETAILED DESCRIPTION OF THE PREFERRED EMBODIMENTS

Figure 4:
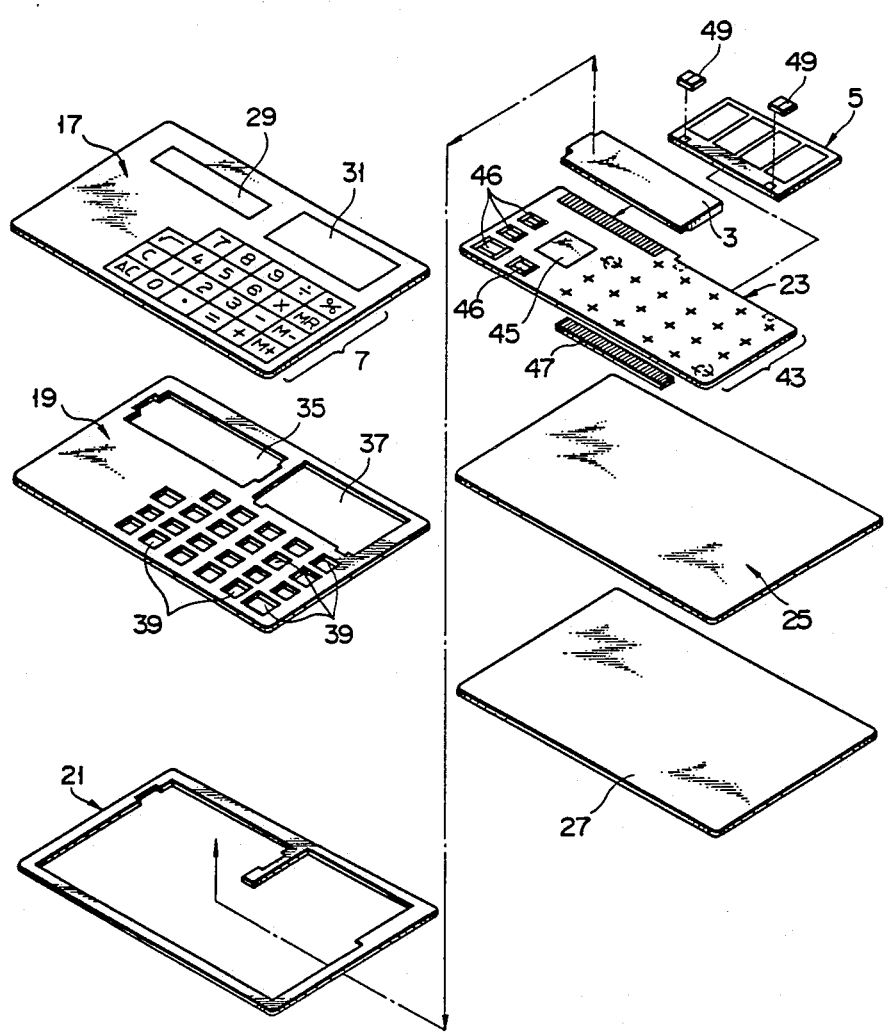
FIG. 4 is an exploded view of the calculator shown in FIG. 1.

A card-like electronic calculator having a credit card function according to the first embodiment of the present invention will be described hereinafter, with reference to FIGS. 1 to 5.

As is shown in FIG. 1, a liquid crystal display unit 3, a solar cell 5, and a keyboard unit 7 are arranged on the top surface of an electronic calculator 1. The display unit 3 comprises a liquid crystal display cell in which a liquid crystal element is sealed between a pair of film base materials, such as polyester films. The display unit 3 is used for displaying data such as calculation data, a calculation result, and the like. The solar cell 5 comprises a solar cell element which is formed on a film base material and has an epoxy resin roll-coated thereon. The solar cell 5 is a power supply source of the calculator 1. The keyboard unit 7 comprises various keys 9 such as numerical and function keys for inputting data such as calculation data.

A magnetic stripe portion 11 and first and second embossed portions 13 and 15 are provided on the back surface of the calculator 1, as is shown in FIG. 2. Various magnetic data are recorded on the magnetic stripe portion 11. The first and second embossed portions 13 and 15 have identification data of the calculator 1.

An arrangement of the calculator 1 will now be described, with reference to FIGS. 3 and 4. The calculator 1 is constructed by overlying an uppermost sheet 17, an upper sheet 19, a frame 21, a circuit board 23, a lower sheet 25, and the lowermost sheet 27 on one another in the above order. The uppermost sheet 17 is a resin film such as a polyester film, and is adhered to the upper sheet 19. Transparent windows 29 and 31 are formed in portions of the sheet 17 corresponding to the display unit 3 and the solar cell 5. Key indicia are printed on the sheet 17, at positions corresponding to the keys 9 of the keyboard unit 7. A remaining portion is colored, or else a figure is printed thereon. Movable contacts 33 (FIG. 3) are arranged on the inner surface of the sheet 17, at positions corresponding to the keys 9.

The upper sheet 19 is formed of a flexible resin such as vinyl chloride. Openings 35 and 37 are formed in the upper sheet 19. These openings 35 and 37 are formed to correspond to the windows 29 and 31 of the sheet 17. Openings 39 are formed in the sheet 19, so as to correspond to the keys 9. When the keys 9 are depressed, the contacts 33 are brought into contact with stationary contacts 43 (to be described later) through the openings 39.

The circuit board 23 is attached to the lower surface of the upper sheet 19. The circuit board 23 is a film sheet. The contacts 43 are provided on an upper surface of the board 23. When one of the keys 9 is depressed it corresponding contact 33 is brought into contact with the corresponding contact 43. The contacts 43 are of a split type. One end of each split type contact 43 is connected to a timing pulse output terminal of an integrated circuit 45 (to be described later). The other end of each contact 43 is connected to an input terminal of the integrated circuit 45. The keys 9, the movable contacts 33 and the stationary contacts 43 constitute the keyboard unit 7.

Openings 41 are formed in the circuit board 23. The integrated circuit 45 and chip parts 46 are mounted in the openings 41. Thus, the thickness of the integrated circuit 45 and chip parts 46 does not affect that of the calculator 1. The display unit 3 and the solar cell 5 are connected through heat seals 47 and 49. Respective electrode terminals (not shown) of the display unit 3 and the solar cell 5 are connected to the board 23. The display unit 3 is arranged in the opening 35 of the upper sheet 19 and is adhered to the lower surface of the display window 29 of the uppermost sheet 17. The solar cell 5 is arranged in the opening 37 of the upper sheet 19 and is adhered to the lower surface of the window 31 of the sheet 17.

The lower sheet 25 is adhered to the lower surface of the circuit board 23. The lower sheet 25 is a flexible sheet made of hard vinyl chloride. The frame 21 if formed of a flexible resin such as hard vinyl chloride. The circuit board 23 is arranged in the frame 21. The board 23 is fixed by an adhesive 51, for example, epoxy region which is used between the board 23, the frame 21 and the lower sheet 25. The adhesive 51 is also used around an outer periphery of the frame 21, to seal the uppermost sheet 17 and the lowermost sheet 27. The lowermost sheet 27 is adhered to the lower sheet 25. As described above, the lowermost sheet is provided with the magnetic stripe portion 11 and the embossed portions 13 and 15.

Thicknesses of the respective portions described above are as follows: the uppermost sheet 17, about 0.08 mm; the upper sheet 19, 0.1 mm; the display unit 3, 0.55 mm; the solar cell 5, 0.2 mm; the circuit board 23, 0.25 mm; the frame 21, 0.4 mm; the integrated circuit 45, 0.4 mm; the lower sheet 25, 0.1 mm; and the lowermost sheet 27, 0.05 mm. The calculator 1 has an overall thickness of about 0.8 mm, a length of 85.5 mm and a width of 54 mm. This size is the same as that of a credit card.

Note that the term credit card is used here to define a card having identification data such as a plastic card (so-called credit card) which a consumer presents for payment in credit sales and for identifying a membership number, a card (cash card) for withdrawing and depositing money in a bank, an identification card, and the like.

An arrangement of the lowermost sheet 27 will be described in detail with reference to FIGS. 2 and 5.

As shown in FIG. 2, the magnetic stripe portion 11 is formed longitudinally at an upper end portion of the sheet 27 in the calculator 1. The portion 11 can be formed by fixing a magnetic sheet on the lowermost sheet 27. Furthermore, the first and second embossed portions 13 and 15 are formed on the lower side of the sheet 27 along the longitudinal direction of the calculator 1. Magnetic data such as a password or a membership number is recorded on the magnetic stripe portion 11. The data can be recorded by a conventional method. Characters and numerals projecting from the sheet 27 are arranged on the first and second embossed portions 13 and 15 so as to present predetermined information. The portion 13 has identification code data. Identification data such as the name of the holder of this calculator 1, an acquisition date, or the like is embossed on the second embossed portion 15. These portions 13 and 15 are formed by screen-printing a vinyl chloride resin on the sheet 27 several times. The outer shape of this calculator 1 and the positions of the first and second embossed portions 13 and 15 and the magnetic stripe portion 11 are suited for an I-type card prescribed in ISO 2894, ISO 3554, and JIS B 9560. Therefore, in FIGS. 2 and 5, respective sizes of the respective portions are set as follows. Note that a unit is mm.

| | |
|---|---|
| $X = 85.47$ to $85.72$ | $Y = 53.92$ to $54.03$ |
| $Z = 0.76 \pm 0.08$ | $D = 4.32$ |
| $E = 21.42 \pm 0.12$ | $G = 0.48_{-0.05}^{+0}$ |
| $K = 0.46_{-0.05}^{+0}$ | $a = 5.54$ |
| $b = 11.89$ | $c = 6.35$ |

Note that these sizes are shown as an example. In practice, even if these sizes do not completely coincide with the above standard, the cards can be used with current terminal devices and verification machines. If the card is formed, based upon the above sizes and serves as a credit card, the sizes of other portions are not significant.

The calculator 1 can be constructed to include only the embossed portions 13, 15 and not the magnetic stripe portion 11. In this case, the back surface of the calculator is used only to print the identification data of the embossed portion on a slip of paper when inserted in a printer. Thus it is required only that the thickness from the top surface of the calculator 1 to the peak of the embossed portions 13 and 15 (i.e., $Z+K$ and $Z+G$ in FIG. 5) is satisfied. It may be sufficient for the projection height of the embossed portion 13 or 15 ($G$ or $K$) to have the range between 0.1 to 0.2 mm. Thus the calculator 1 may be slightly large in its thickness. Alternatively, only the magnetic stripe portion 11 can be provided and the embossed portions 13 and 15 can be omitted. In this case, the stripe portion 11 can be arranged at a position on the embossed portion 13 or 15.

Figure 6:
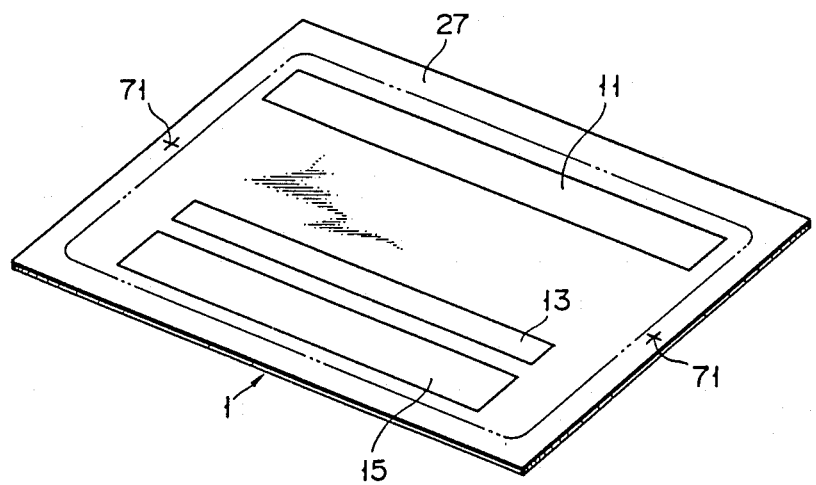
FIG. 6 is a view for explaining a method of assembling the electronic calculator shown in FIG. 1.

A method of assembling the calculator 1 will be described hereinafter with reference to FIG. 6. The uppermost sheet 17 is formed to be larger than the completed calculator 1 shown in FIGS. 1 and 2, and alignment marks (not shown) are printed thereon. The upper sheet 19 and the frame 21 are adhered to the sheet 17. The display unit 3, the solar cell 5, the integrated circuit 45 and the chip parts 46 are mounted on the circuit board 23. The circuit board 23 is placed in the frame 21. The space above the circuit board 23 is filled with the adhesive 51, and the lower sheet 25 is placed thereon. The space around the frame 21 is also filled with the adhesive 51. The lowermost sheet 27, provided with the embossed portions 13 and 15 and the magnetic stripe portion 11, is adhered to the sheet 25. Alignment marks 71 are provided on the lowermost sheet 27 in the same manner as on the sheet 17. When the alignment marks 71 coincide with those of the sheet 17, the sheet 27 is aligned. When the sheet 27 is adhered, the uppermost sheet 17, the upper sheet 19, the adhesive 51, the lower sheet 25 and the lowermost sheet 27 are cut along alternate long and two short-dashed lines in FIG. 6. The above structure is preferably cut about 0.1 to 0.3 mm from frame 21. In this manner, the card-like electronic calculator whose one surface serves as a calculator and the other surface serves as a credit card can be obtained.

An electronic calculator according to this embodiment has the same outer shape as that of a credit card, and has the magnetic stripe portion 11 and the embossed portions 13 and 15. Thus, a user holds a calculator and a credit card.

Figure 7:
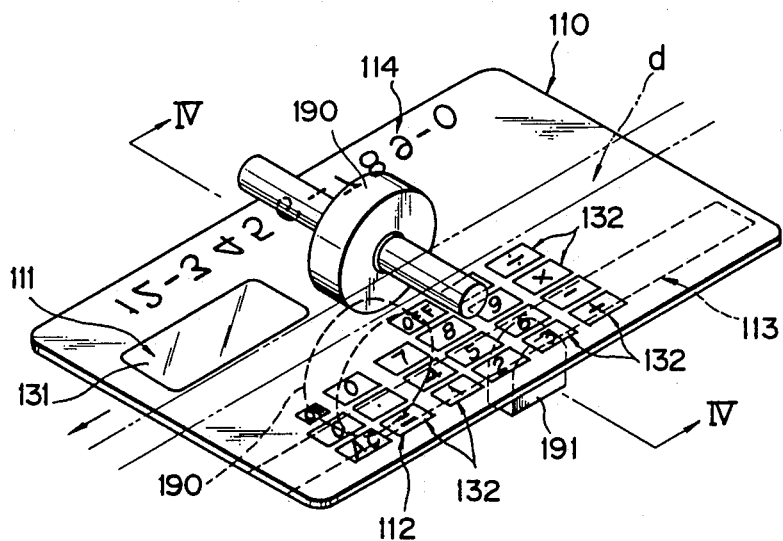
Figure 8:
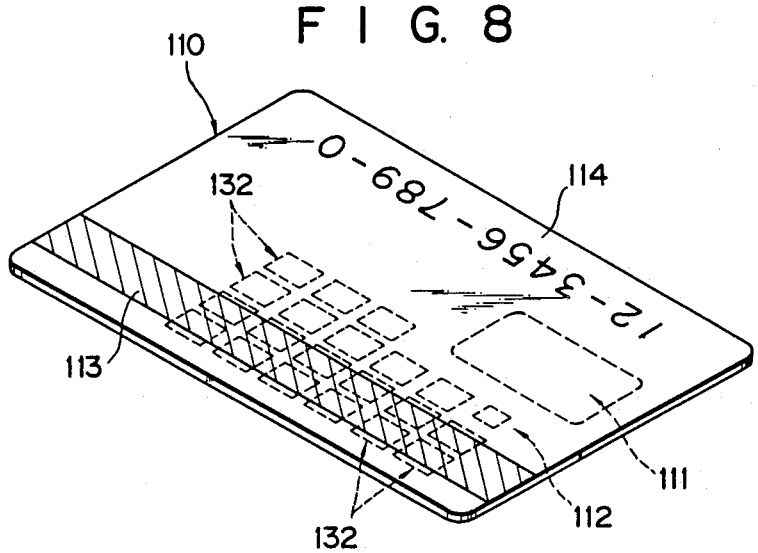

The second embodiment of this invention will now be explained referring to FIGS. 7 to 16. The electronic card according to this embodiment has the exterior as shown in FIGS. 7 and 8. The card assembly, denoted by reference numeral "110," has a display unit 111 and a keyboard unit 112 provided on its top surface, and has a magnetic stripe 113 formed on the back surface along the upper edge. The card assembly 110 has embossed characters 114 formed on the back surface along the lower edge. The card assembly 110 has a size of 85.5 mm (length)×54 mm (width)×0.8 mm (thickness), which complies with the ISO standard. The magnetic stripe 113 and the embossed characters 114 also comply with the JIS or ISO standard.

Figure 16:
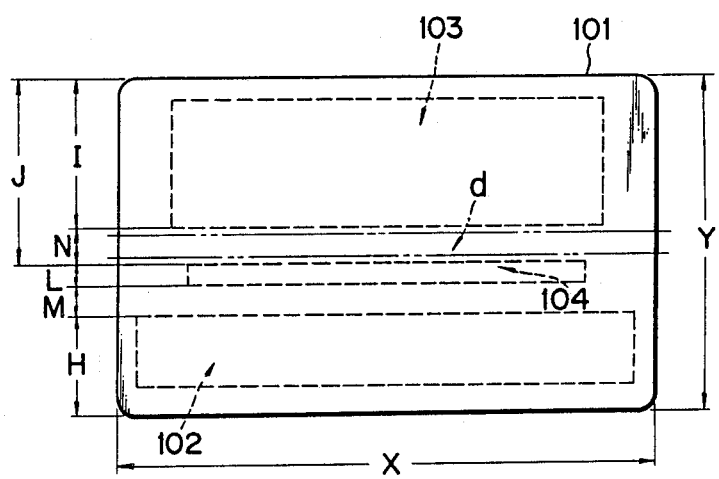

FIG. 16 illustrates the regions on a card where the magnetic stripe, the embossed characters and a bar code are formed. A card 101 has a rectangular shape with a length X of about 85.5 mm and a width Y of about 54 mm. The positions to provide the magnetic stripe and the embossed characters comply with JIS B 9560 or ISO 2849, and the magnetic stripe is formed along one edge of the card 101. It should be noted that JIS B 9560 is not the same as ISO 2849, and that the magnetic stripe could have two different widths as defined by JIS B 9561. In either case, i.e., whether based on the JIS or ISO standard, the magnetic stripe is formed within a region 102 with a width H of about 16 mm, away from one edge of the card 101, while the embossed characters are formed within a region 103 with a width I of about 24 mm, away from the opposite edge. In FIG. 16, a reference numeral 104 denotes a region where a bar code is formed and which is provided at a location with a distance J of 27.9 mm from the opposite edge of the card 101 based on JIS B 9552 or ISO 3554 (these two rules being identical). The bar code region 104 has a width L of 3.4 mm.

There is an about 4.9 mm space M between the magnetic stripe region 102 and the bar code region 104, while there is an about 5.7 mm space N between the embossed character region 103 and the bar code region 104. To permit the card complying either one of the aforementioned standards to be fed in a card reading apparatus avoiding the magnetic stripe or embossed characters and bar code portion, the card may be fed by grabbing either the space M or N by means of feeding rollers. In general, the region between the embossed character region 103 and the bar code region 104, namely, the space N which is wider than the space M and is closer to the center portion of the card 101, is used as a roller guide region d. As shown in FIG. 7, the upper and lower card feeding rollers 190 of the card reading apparatus are provided at the location corresponding to the roller guide region d. The width (axial length) of the card feeding rollers 190 is set slightly smaller than the space N (about 5.7 mm) between the embossed character region 103 and bar code region 104. A reading head 191 of the card reading apparatus has a read width covering the entire width of the magnetic stripe region 102 so that it can read recorded information on the magnetic stripe irrespective of where the magnetic stripe is located in the magnetic stripe region 102. An optical reading unit for reading a bar code is provided at the location corresponding to the bar code region 104 of the card 101.

Figure 10:
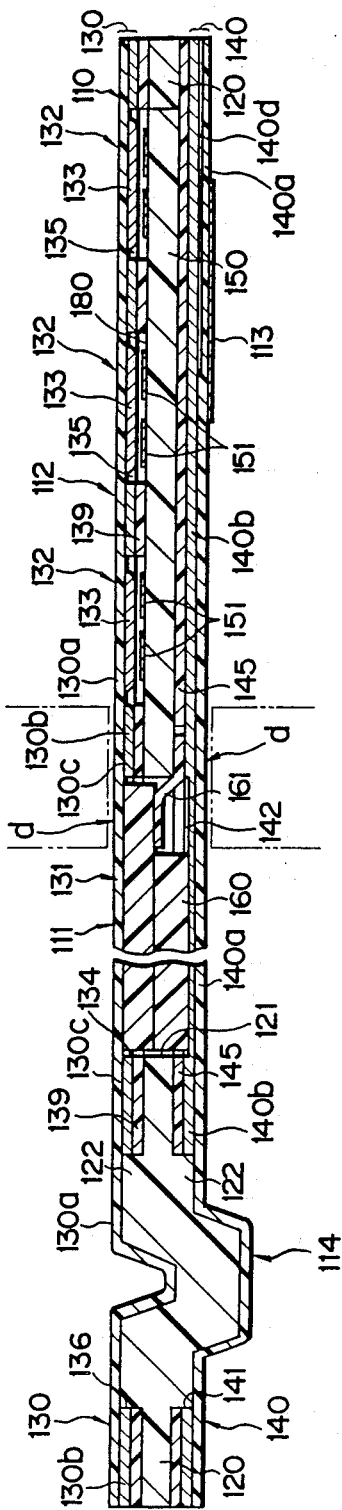

The structure of the electronic card will now be explained. In FIGS. 9 and 10, reference numerals "120," "130" and "140" respectively denote the core member, the upper cover and the lower cover of the card assembly 110. The card assembly 110 is constituted by adhering the upper cover 130 and lower cover 140 onto the top and bottom surfaces of the core member 120, respectively. The core member 120 is shaped in a frame having a large calculator module accommodation opening 121 surrounded by the peripheral portion that constitutes the outer wall of the card assembly 110. Thick portions 122 for formation of the embossed characters 114 protrude from the embossed character region on the upper edge portion of the core member 120. The core member 120 is made of a material that well permits protruding of the embossed characters 114, for example, of a thermal plasticity, high polymer resin such as hard vinyl chloride or a soft metal such as aluminum.

The card assembly 110 accommodates a calculator module 180, which has a printed circuit board 150 coupled to a liquid crystal display panel 160 and a sheet-type main battery 170. The printed circuit board 150 has a number of stationary key contacts 151 two-dimensionally arranged on its top surface. As shown in FIG. 9, an LSI chip 152 is provided on the circuit board 150 avoiding where the stationary key contacts 151 are formed. The LSI chip 152 is inserted in an opening 153 formed in the circuit board 150 and is connected to the wires formed on the circuit board 150. The connecting portion of the LSI chip 152 is coated with epoxy resin or the like. The liquid crystal display panel 160 is arranged with the circuit board 150 to fit to the cutaway portion formed on the upper edge of the circuit board 150. The liquid crystal display panel 160 is connected to the bottom surface of the circuit board 150 by means of a heat seal connector 161. The sheet-type battery 170, which is arranged with the circuit board 150, has a power generation unit, constituted by a lithium metal leaf layer, a manganese dioxide print layer and a separation layer containing electrolyte, and node portions 171 formed by extending the electrode leaves attached on the top and bottom surfaces of the power generation unit. The node portions 171 are soldered to the bottom surface of the circuit board 150. The calculator module 180 is disposed in the opening 121 of the core member 120 and is positioned by the periphery of the opening 121. The stationary key contacts 151 are located, not overlapping the roller guide region d (see FIGS. 7 and 10) which are sandwiched by the feeding rollers 190 of the card reading apparatus. The LSI chip 152 is also located, not overlapping the roller guide region d. The liquid crystal display panel 160 has a liquid crystal filling portion (display region) arranged above the roller guide region d at the card's upper portion so as not to overlap the region d. The liquid crystal display panel 160 is disposed in such a way that only its node array portion where the heat seal connector 161 is connected reaches the roller guide region d to a nearly half the width of the region d.

The upper cover 130 of the card assembly 110 comprises a flexible sheet 130a constituting the top surface of the card assembly and a hard support panel 130b laminated on the bottom surface of the flexible sheet 130a. The support panel 130b supports the flexible sheet 130a at its bottom. The flexible sheet 130a has a transparent display window 131 at a region corresponding to the display region of the liquid crystal display panel 160. The sheet 130a also has key operating portions 132 at regions which respectively correspond to the key contacts 151 formed on the circuit board 150. The flexible sheet 130a is constituted by putting a face print on a transparent resin sheet formed of hard vinyl chloride resin, excluding the display window 131, and printing key indicia on the individual key operating portions 132. The flexible sheet 130a has an adhesive layer 130c on the face print. Movable key contacts 133, which contact the stationary key contacts 151 by depression of the key operating portions 132, are formed at the back of the individual key operating portions 132 by means of a carbon ink print or the like. The hard support panel 130b is constituted by a thin plate of metal such as stainless steel. A display opening 134 and key operation openings 135 are formed in those region of the hard support panel 130b which respectively correspond to the display window 131 and the key operating portions 132 of the flexible sheet 130a. The key operating openings 135 are long in the horizontal direction over the entire length of the corresponding rows of key contacts 151. Of the key operation openings 135, an opening 135a facing a power key contact, namely, the "ON" display, has a width $W_2$ (see FIG. 12A) narrower than the width $W_1$ of the other key openings (see FIG. 12B) in order to prevent the power key from being ON while the card is being carried or is loaded into the card reading apparatus.

Figure 11:
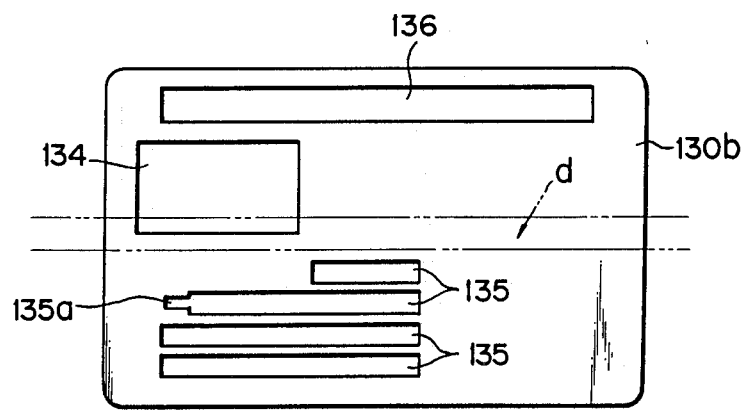
Figures 12A, 12B:
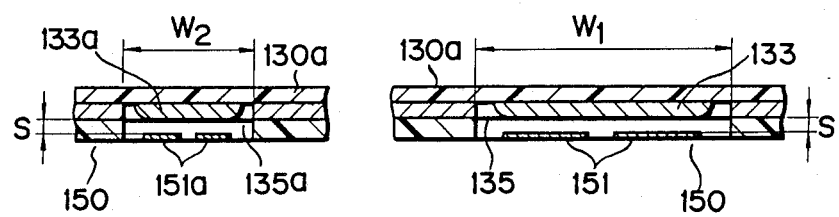
FIGS. 12A and 12B are diagrams illustrating the relationships between key contact openings and the intervals between stationary contacts and movable contacts.

It is desirable that the opening width $W_2 = (10-50) \times S$ where S is the space between the stationary key contacts 151a and movable key contacts 133a. For instance, with $S = 0.08$ mm, $W_2 = 1 \sim 4$ mm. All of the key operation openings 135 are located away from the roller guide region d, as shown in FIG. 11. The display opening 134 has only its one edge portion reaching the region d to a nearly half the width of region d. The hard support panel 130b has an opening (cutaway portion) 136 formed therein to fit on the embossed character thick portion 122 of the core member 120. A recess 137 for accommodating the top portion of the LSI chip 152 which protrudes from the circuit board 150 and a recess 138 for accommodating the top portion of the sheet-type battery 170 are formed on the back surface of the support panel 130b by half etching. The upper cover 130 is adhered to the top surfaces of the core member 120 and the circuit board 150 by means of a double adhesive sheet 139 (a sheet 139 having both surfaces applied with adhesive) that has openings in those regions thereof which correspond to the openings 134, 135 and 136 and the recesses 137 and 138 of the support panel 130b. The movable key contacts 133 formed below the individual key operating portions 132 of the flexible sheet 130a face the stationary key contacts 151 of the circuit board 150 with the support panel 130b and adhesive sheet 139 as spacers (see FIG. 10).

The lower cover 140 of the card assembly 110 comprises an outer sheet 140a, which constitutes the back surface of the card assembly 110 and is formed of soft vinyl chloride resin, etc., and a hard support panel 140b, which is formed, for example, by a stainless thin plate and is laminated on the back of the outer sheet 140a to support it at the back. On the outer surface of the outer sheet 140a is provided the magnetic stripe 113. The hard support panel 140b is formed by a non-magnetic material to avoid adversely influencing information writing onto and reading from the magnetic stripe 113. The outer sheet 140b has an opening (a cutaway portion) 141 to fit to the thick portion 122 of the core member 120. A recess 142 for accommodating the bottom portion of the liquid crystal display panel 160, a recess 143 for accommodating the lower portion of the LSI chip 152 that protrudes downward from the circuit board 150, and a recess 144 for accommodating the lower portion of the sheet-type battery 170 are formed on the back of the support panel 140b by half etching. The support panel 140b and the outer sheet 140a are laminated by coating either the outer surface of the support panel 140b or the inner surface of the outer sheet 140a with an adhesive material 140c (which is coated on the outer sheet 140a in this embodiment) and pressing the support panel 140b and outer sheet 140a by means, for example, of pressure rollers. In this embodiment, the adhesive material 140c is coated on the outer sheet 140a as shown in FIG. 9 by the screen print, etc., excluding a recording region of the magnetic stripe 113 (the region other than dummy regions provided at both ends of the magnetic stripe which are not used for data writing and reading). And the hard support panel 140b and outer sheet 140a are adhered together, excluding the region corresponding to the recording region of the magnetic stripe 113. With regard to a credit card, it is required according to the JIS or ISO standard to secure dummy regions at both ends of the magnetic stripe which involve no data writing nor reading. The JIS standard defines the length l (see FIG. 9) of the dummy region at either end of the magnetic stripe to be 5 mm or greater while the ISO standard defines that length to be 6.93 mm or greater. In addition, according to this embodiment the support panel 140b is adhered to the outer sheet 140a with the adhesive material 140c being also coated on the region corresponding to the dummy regions of the magnetic stripe, thereby providing a sufficient bonding strength between the panel 140b and the sheet 140a at the region corresponding to the magnetic stripe 113.

As described above the adhesive material 140c is coated on the outer sheet 140a excluding the region corresponding to the recording region of the magnetic stripe 113 and the sheet 140a is adhered with the back surface (support panel 140b) of the card assembly 110 only at that region which does not correspond to the recording region of the magnetic stripe 113. Accordingly, even if the coating thickness of the adhesive material 140c is not uniform or bubbles in the adhesive layer expand, no upheavals would be formed in the recording region of the magnetic stripe 113. That is, the entire recording region of the magnetic stripe 113 is completely flat. This provides a constant contact pressure of the magnetic head 191 over the entire recording region of the magnetic stripe 113, thus ensuring accurate information writing and reading.

A reference numeral "140d" denotes an air flow groove to let the air between the outer sheet 140a and support panel 140b to flow out from the side of the card assembly 110. When the magnetic head contacts the magnetic stripe 113, the air flows out through the air flow grooves 140d so that the outer sheet 140a is tightly attached to the support panel 140b. This further ensures the accuracy in information reading from the magnetic stripe 113.

The lower cover 140 is adhered to the bottom surfaces of the core member 120 and the circuit board 150 by means of a double adhesive sheet 145 which has openings where corresponding to the opening 141 and recesses 142 to 144 of the support panel 140b.

The flexible sheet 130a and the outer sheet 140a are tightly adhered to the top and bottom surfaces of the embossed character thick portion 122, respectively. With the electronic card assembly being assembled, the embossed characters 114 that represent owner information are formed by applying thermal pressure onto the flexible sheet 130a and outer sheet 140a tightly laminated with the core member 120 sandwiched therebetween and thermally deforming the laminated product. Consequently, the owner information cannot be rewritten without damaging the electronic card assembly. The circuit board 150 in the card assembly 110 is securely adhered to the upper cover 130 and the lower cover 140 by the adhesive sheets 139 and 145. The liquid crystal display panel 160 is fixedly sandwiched between the flexible sheet 130a and the bottom of the recess 142 formed in the support plate 140b. The sheet-type battery 170 is securely sandwiched between the bottoms of the recesses 138 and 144, which are respectively formed in the support panels 130b and 140b. In the above embodiment, one surface of the embossed portion of the card is recessed and another surface of the embossed portion is protruded. The card may have only protrusions by using the following process of assembling the electronic card, with the cover on the projection side of the embossed portion (lower cover 140 in this embodiment) adhered to the core member 120, electronic components may be accommodated after performing the embossing process, and the upper cover may then be adhered. This assembling method can eliminate the need to provide the opening 136 in the hard support panel 130b.

In the electronic card according to this embodiment, since the key operation openings 135 formed in the support panel 130b are located not to overlap the region d, the upper roller 190 abutting on the card surface does not deform the key operating portions 132 of the flexible sheet 130a in a recessed shape so as not to fall in the key operation openings 135. Since the upper roller 190, when passing the display unit 111, is supported at one end through the flexible sheet 130a by the hard support panel 130b, the upper roller 190 does not deform the flexible sheet 130a in a recess shape and does not therefore fall in the display opening 134. The pressure applied by the rollers 190 onto the upper cover 130 and the lower cover 140 is received by the circuit board 150. As a result, the feeding speed for the electronic card is kept constant, thus eliminating a variation in the feeding speed which is inherent to conventional electronic cards. This causes the read head 191 (see FIG. 7) of the card reading apparatus to accurately read out the recorded information on the magnetic stripe 113. In addition, it is possible to prevent accidental depression of the key operating portions 132 by the upper roller 190 and damaging of the liquid crystal display panel 160 by the pressure of the upper roller 190 while the card is being fed in the card reading apparatus. In the card according to this embodiment, although where the sheet-type battery 170 is accommodated overlaps the roller guide region d, the pressure applied on the upper cover 130 and lower cover 140 is received by the battery 170 even when the card feeding rollers 190 pass the battery accommodating region. Since the battery 170 has a sufficient mechanical strength, it is not damaged by the pressure of the rollers 190.

According to the above-described embodiment, the keyboard unit 112 is provided at the card's lower edge below the roller guide region d. However, the keyboard unit 112 may be provided in such a way as to lie on both sides of the region d. In that case, the key contacts in the card assembly need to be arranged on both sides of the region d excluding this region and the key operation openings 135 need to be provided in the support panel 130b of the upper cover 130 as shown in FIG. 13.

Figure 14:
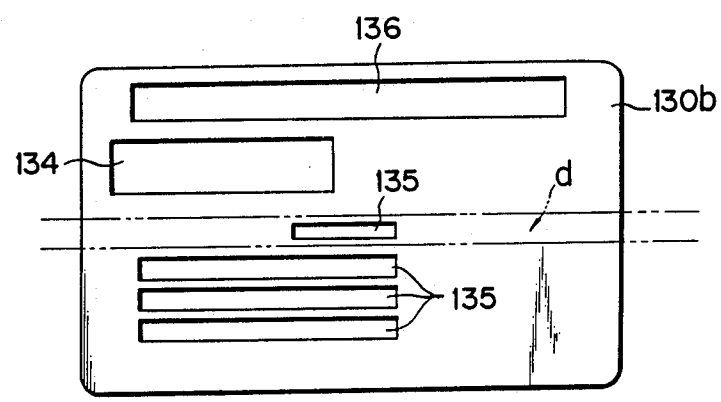

Of the key operation openings 135 that which overlaps the roller guide region d may also be formed at a nearly center portion of the region d, and may have a width narrower than that of the region d as shown in FIG. 14. Also, as shown in FIG. 15 such key operation opening 135 that overlaps the region d may be formed in such a way that one edge portion of the opening 135 overlaps the region d and the width of the overlapping portion of the opening 135 is narrower than the width of the region d.

Figure 13:
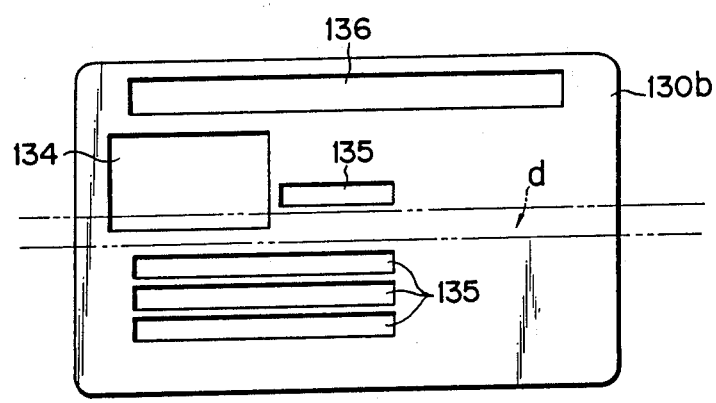
Figure 15:
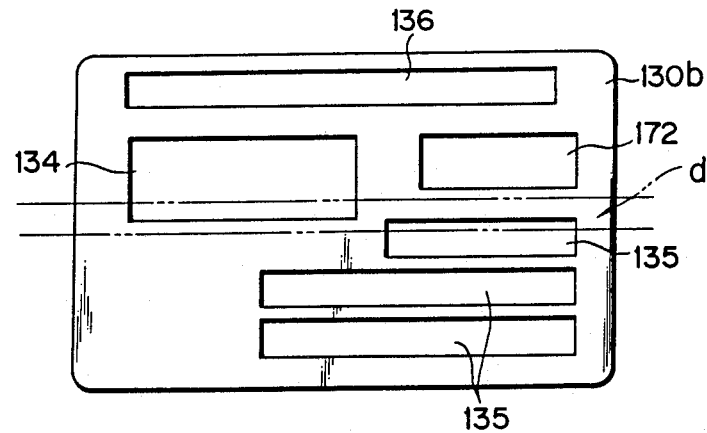

A reference numeral "13638 in FIGS. 13 through 15 denotes an opening in which the thick portion 122 fit.

In the electronic card according to this embodiment, both sides of the card assembly 110 are reinforced by the hard support panels 130b and 140b. Therefore, when the core member 120 is formed of a thermal plastic resin such as hard vinyl chloride or soft metal such as aluminum, which allows for provision of the embossed characters 114, a sufficient mechanical strength of the card assembly 110 against the bending pressure can be provided. This prevents the calculator module 180 disposed inside the card assembly 110 from being damaged when the electronic card is bent. According to this electronic card, the embossed character thick portion 122 of the core member 120 is fit in the openings 136 and 141 of the support panels 130b and 140b and the embossed characters representing the owner information are formed in the thick portion 122. Naturally, the owner information cannot be rewritten without damaging the card assembly 110 so that the card can fully serve as a credit card.

According to the above embodiment, both sides of the card assembly 110 are reinforced by the hard support panels 130b and 140b; however, such a hard support panel may be provided on one side of the card assembly 110. Further, the cutaway portions formed in the support panels 130b and 140b for exposure of the thick portion 122 are window-shaped openings; the cutaway portions may be formed with one edge portion of each support panel 130b or 140b being cut away. Furthermore, the electronic card according to the above embodiment has been explained to be a card-like small electronic calculator provided with the magnetic stripe 113 and embossed characters 114. However, the magnetic stripe 113 should not necessarily be provided. This invention is not limited only to a card-like small electronic calculator, and can widely apply to electronic cards which has, like an IC card provided with a key input section, a key input section provided on its one surface and embossed characters formed along one edge portion of the card assembly that accommodates an input/output module inside.

Figure 17:
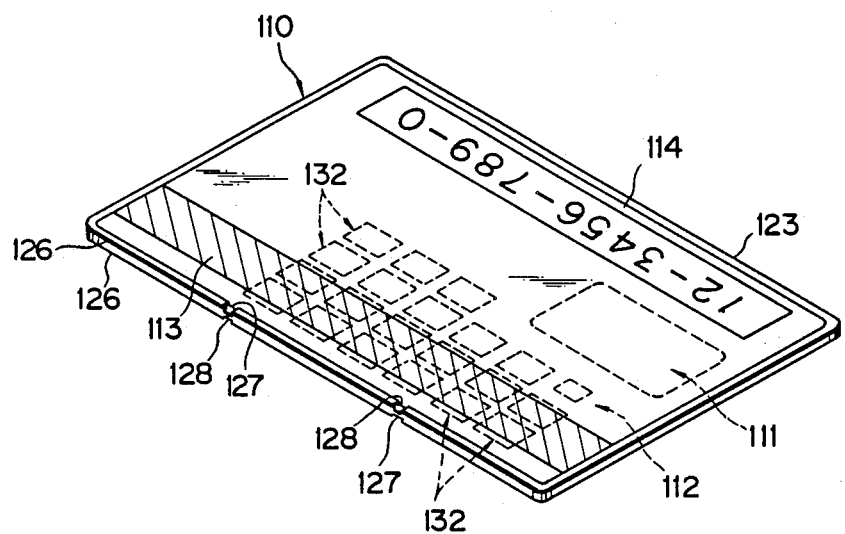
Figure 18:
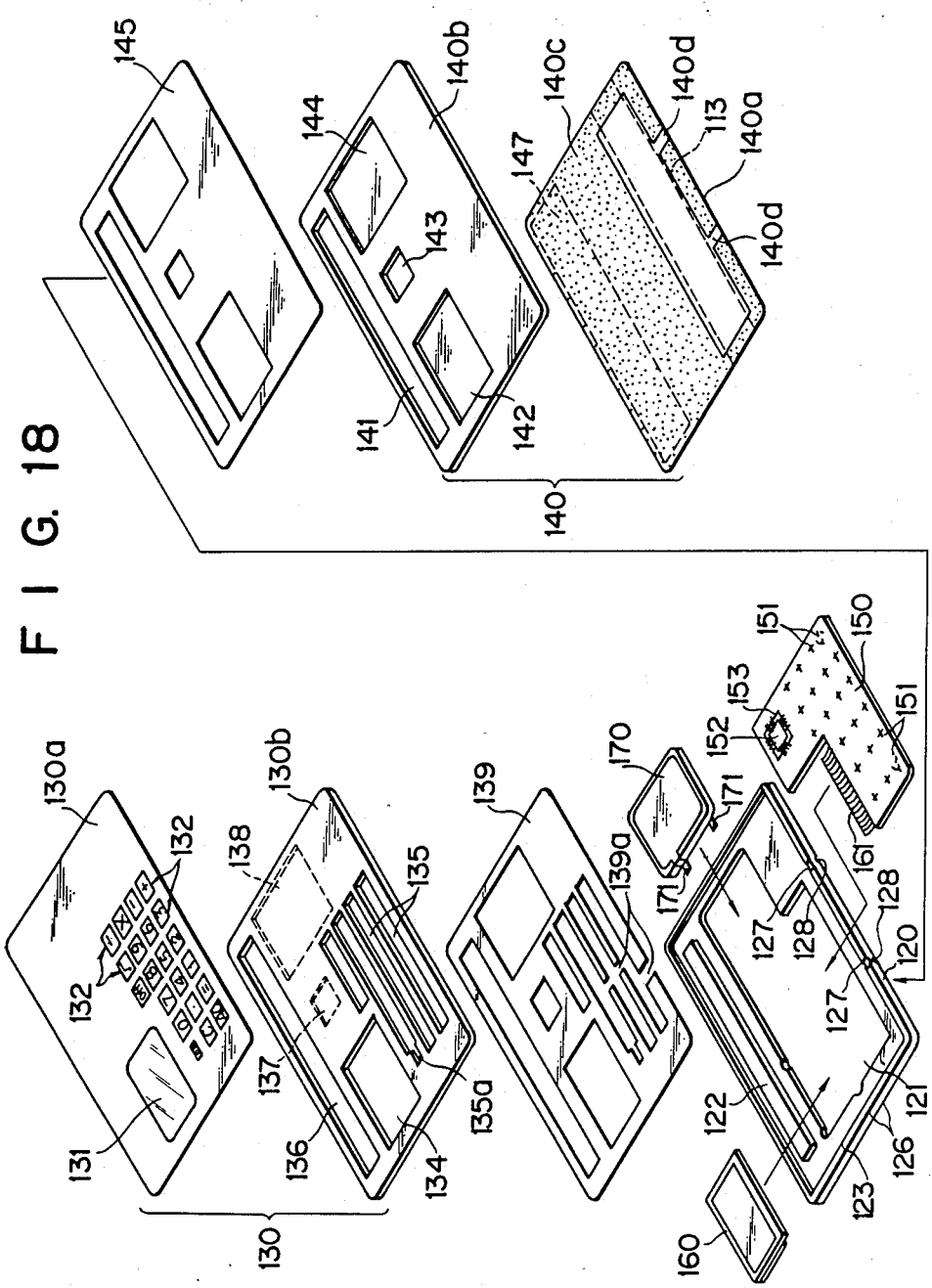
Figure 19:
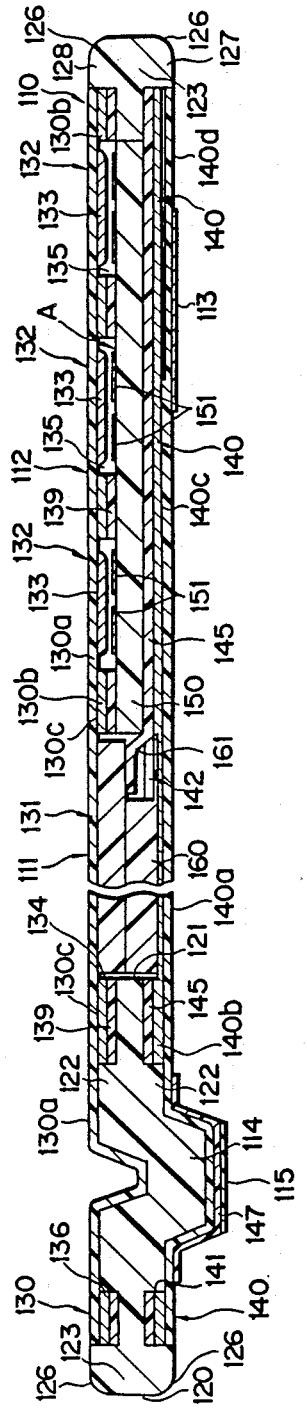

Referring now to FIGS. 17 to 19, the third embodiment of this invention will be explained.

According to the third embodiment, a protecting portion 123 is formed at the periphery of the core member 120, and surrounds the peripheries of the upper cover 130 and lower cover 140. In other words, the periphery of the card assembly 110 is constituted by the projecting peripheral portion 123 of the core member 120. With this design, external members hit the protecting peripheral portion 123 of the core member 120 and does not directly hit where the core member 120 is connected to the covers 130 and 140. This can prevent the upper cover 130 and the lower cover 140 from being separated from the core member 120 when such external members hit the card, and permits the card to be used with the covers 130 and 140 strongly connected to the core member 120. The upper and lower edge portions and the corner portions of the peripheral portion 123 of the core member 120 are provided with chamfering portions 126. When an external member hit the peripheral portion 123, it slides along the slanting faces of the chamfering portions 126. This prevents the external member from being caught at the edge portions or the corner portions of the peripheral portion 123, which would otherwise deform or damage the peripheral portion 123. In this respect, the durability of the core member 120 is improved.

The card according to this embodiment permits the outer sheets 130a and 140a to be formed of a resin having a high size stability against heat or a resin having a lower thermal expansion coefficient, for example, polyester. It is significantly important for prevention of card bending to form the outer sheets 130a and 140a of a material similar to glass-epoxy that is part of the material of the circuit board 150 or stainless steel that constitutes the support panel 130b or 140b. These materials have a high size stability against a change in the ambient environment. The feature to prevent thermal deformation of the card assembly 110 and maintain the flatness even under environments of high temperature and humidity and thermal influence, is necessary to ensure the proper contact of the magnetic head onto the card assembly 110 for accurately reading out information recorded on the magnetic stripe 113 as well as to preserve the external appearance. Polyester which is a material for the flexible sheet 130a and outer sheet 140a, has excellent physical characteristics including the size stability and environmental durability and satisfies the above conditions.

According to the third embodiment, a dressing layer 115 is formed on the embossed characters 114. However, thermal softening temperature so that the thermal transfer of the dressing material for forming the dressing layer 115 is not well performed, thus preventing the dressing material from being strongly secured on the embossed characters 114. As a solution to this problem, according to this embodiment, the embossed character region on the outer surface of the sheet 140a is coated with a transparent resin layer 147, for example, of vinyl chloride having a low thermal softening temperature (transparent resin to permit easy thermal transfer of the dressing material) and the dressing material 115 is thermally transferred onto that surface. With this structure, the dressing material is securely fixed on the surface of the transparent resin layer 147 so that the dressing layer 115 is securely formed on the embossed characters 114.

In other words, the transparent resin layer 147 of vinyl chloride, etc. is printed on the outer surface of the outer sheet 140a of polyester having the background pattern printed thereon, the flexible sheet 130a, core member 120 and the outer sheet 140a are laminated one upon another (i.e., the assembly of the electronic card being completed), the embossed characters are then formed, and the dressing layer 115 is thermally transferred onto the transparent resin layer 147 printed on the top surface of the embossed characters.

Moreover, according to this embodiment communication holes 127 and 128 facing the air flow grooves 140d are formed in the peripheral portion 123 of the core member 120. The communication holes 128 are for permitting the key operation openings 135 to communicate with the outside through an air flow passage 139a formed in the double adhesive sheet 139 when the key operating portions are depressed or released.

The other portions of the third embodiment is the same as those of the second embodiment and are denoted by the same reference numerals to avoid their redundant explanation.

According to the third embodiment, both sides of the card assembly 110 are also reinforced by the hard support panels 130b and 140b. Therefore, if the core member 120 is formed of a material to permit provision of the embossed characters 114, the card assembly 110 has a sufficient mechanical strength against the bending force so as to prevent the calculator module 180 inside the assembly 110 from being damaged by bending of the electronic card. In this card, the embossed character thick portion 122 is fit in the openings 136 and 141, and the embossed characters representing the owner information are then formed in the thick portion 122. This makes it impossible to rewrite the owner information without damaging the electronic components so that this card can fully serve as a credit card.

What is claimed is:

1. A card-like electronic apparatus comprising:
   electronic device means;
   case means made of a press-treatable material having an accommodation section to accommodate said electronic device means and a projecting portion of a uniform thickness for formation of an embossment;
   a cover, located on one surface of said case means in which said electronic device means is accommodated; and
   supporting member means situated on the other surface of said case means and having a cutaway portion in which said projecting portion is fit.

2. The apparatus according to claim 1, wherein said case means is formed of a thermal plasticity high polymer resin.

3. The apparatus according to claim 1, wherein said case means is formed of soft metal.

4. The apparatus according to claim 1, wherein said electronic device means includes an IC chip.

5. The apparatus according to claim 4, wherein said electronic device means further includes a display unit.

6. The apparatus according to claim 5, wherein said electronic device means further includes a printed circuit board having key contacts and a battery cell connected to said electronic device means.

7. A card-like electronic apparatus comprising: electronic device means; and
    a main body including a frame portion having an accommodation section, to accommodate said electronic device means, and a thick portion, thicker than said frame portion and having an embossment formed with one surface recessed and the other surface protruding.

8. The apparatus according to claim 7, wherein said main body is formed of a thermal plasticity high polymer material.

9. The apparatus according to claim 7, wherein said main body is formed of soft metal.

10. The apparatus according to claim 7, wherein said thick portion has one surface protruding from one surface of said frame portion and the other surface protruding from the other surface of said frame portion.

11. The apparatus according to claim 10, wherein hard panels in which those portions aligned with said one and other surfaces of said thick portion are cut away, are formed on one surface and the other surface of said main body, respectively.

12. The apparatus according to claim 11, wherein said hard panels are stainless plates.

13. The apparatus according to claim 11, wherein said electronic device means includes a printed circuit board having key contacts and an IC chip connected to said board, and one of said hard panels has an opening aligned with said key contacts.

14. The apparatus according to claim 13, wherein an uppermost plastic sheet is located on an outer surface of said hard panel having said opening and has key contacts at a region aligned with said opening of said hard panel.

15. A card-like electronic apparatus comprising: electronic device means;
    a core member including a frame portion having an accommodation section, to accommodate said electronic device means, and a thick portion protruding from at least one surface of said frame portion;
    an uppermost sheet located on one surface of said core member and having approximately the same dimensions as said core member;
    a lowermost sheet located on the other surface of said core member and having approximately the same dimensions as said core member; and
    a hard panel having a cutaway portion in which said thick portion is fit, and situated between said core member and one of said uppermost and lowermost sheets, wherein an embossment is formed in such a way that each of said uppermost sheet, said core member, and said lowermost sheet has one surface recessed and other surface protruding.

16. The apparatus according to claim 15, wherein the top surface of said embossment on at least one of said uppermost and lowermost sheets is coated with a high molecular resin layer having a lower softening temperature than said sheet, and said high molecular resin layer is coated with a color dressing layer.

17. A card-like electronic apparatus comprising:
    cover means including a pressure-deformable sheet member having a print layer for key display, and a display window;
    electronic assembly means including a printed circuit board having a plurality of key contacts, an IC chip connected to said board, an electronic display unit connected to said board, and a flat battery connected to said board; and
    a case having a deep cavity for accommodating said electronic assembly means, a shallow cavity formed around said deep cavity, to accommodate said cover, and a peripheral portion constituting the periphery of said shallow cavity, said peripheral portion having a thick portion in the vicinity of said deep cavity for forming an embossment therein.

18. The apparatus according to claim 17, wherein said flat battery is a primary battery.

19. The apparatus according to claim 17, wherein said projecting peripheral portion of said case means has a cutaway portion for discharging air inside a key operating portion to the outside.

20. The apparatus according to claim 17, wherein said case means has a data recording portion containing data including card owner information.

21. A card-like electronic apparatus comprising:
    electronic assembly means including a printed circuit board having a number of first key contacts, an IC chip connected to said board, an electronic display unit connected to said board, and a thin flat battery connected to said board; and
    cover means including an accommodation section for accommodating said electronic assembly means, and including a number of second key contacts opposed to said first key contacts, a key indicia aligned with each of said first key contacts, a pressure-deformable sheet member having a display window opposed to said display unit, and a spacer layer having a plurality of wide openings and at least one narrow opening formed therein where said first and second key contacts are opposing each other, said narrow opening of said spacer layer being narrower than any of said wide openings and having a width W defined to be $W=(10-50)S$ where S is a space between said first and second key contacts.

22. The apparatus according to claim 21, wherein said card assembly has a data recording portion containing data including card owner information.

* * * * *